(12) United States Patent
Park

(10) Patent No.: US 7,488,435 B2
(45) Date of Patent: Feb. 10, 2009

(54) COPPER(I) COMPLEXES AND PROCESSES FOR DEPOSITION OF COPPER FILMS BY ATOMIC LAYER DEPOSITION

(75) Inventor: Kyung-Ho Park, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 302 days.

(21) Appl. No.: 11/500,569

(22) Filed: Aug. 7, 2006

(65) Prior Publication Data

US 2008/0075958 A1    Mar. 27, 2008

(51) Int. Cl.
*H01B 1/06*   (2006.01)
*B05D 5/12*   (2006.01)
*C23C 16/18*   (2006.01)
*C23C 16/455*   (2006.01)
*C07F 1/08*   (2006.01)

(52) U.S. Cl. .................. 252/519.2; 427/124; 427/96.8; 427/250; 544/253; 544/278; 556/110

(58) Field of Classification Search .............. 252/519.2; 427/123, 124, 96.8, 250; 544/253, 278; 556/110
See application file for complete search history.

(56) References Cited

U.S. PATENT DOCUMENTS

| | | | |
|---|---|---|---|
| 7,371,880 B2 * | 5/2008 | Xu et al. | ...................... 556/110 |
| 2003/0135061 A1 | 7/2003 | Norman et al. | |
| 2005/0227007 A1 | 10/2005 | Bradley et al. | |
| 2006/0099343 A1 * | 5/2006 | Thompson et al. | .......... 427/250 |

FOREIGN PATENT DOCUMENTS

| WO | WO 03/095701 A1 | 11/2003 |
|---|---|---|
| WO | WO 2004/094689 A2 | 11/2004 |
| WO | WO 2006/015200 A1 | 2/2006 |
| WO | WO 2006/033731 A2 | 3/2006 |
| WO | WO 2008/018861 * | 2/2008 |

OTHER PUBLICATIONS

Ritala et al., "Atomic Layer Deposition", Handbook of Thin Film Materials, H.S. Nalwa, Editor, Academic Press, San Diego (2001), vol. 1., Chap. 2.
PCT International Search Report and Written Opinion for International Application No. PCT/US2006/030707 dated May 8, 2007.

\* cited by examiner

*Primary Examiner*—Mark Kopec

(57) ABSTRACT

The present invention relates to novel 1,3-diimine copper complexes and the use of 1,3-diimine copper complexes for the deposition of copper on substrates or in or on porous solids in an Atomic Layer Deposition process.

11 Claims, No Drawings

COPPER(I) COMPLEXES AND PROCESSES FOR DEPOSITION OF COPPER FILMS BY ATOMIC LAYER DEPOSITION

FIELD OF THE INVENTION

The present invention relates to novel 1,3-diimine copper complexes. The invention also relates to processes for forming copper deposits on substrates or in or on porous solids, using the 1,3-diimine copper complexes.

BACKGROUND

Atomic layer deposition (ALD) processes are useful for the creation of thin films, as described by M. Ritala and M. Leskela in "Atomic Layer Deposition" in *Handbook of Thin Film Materials*, H. S. Nalwa, Editor, Academic Press, San Diego, 2001, Volume 1, Chapter 2. Such films, especially metal and metal oxide films, are critical components in the manufacture of electronic circuits and devices.

In an ALD process for depositing copper films, a copper precursor and a reducing agent are alternatively introduced into a reaction chamber. After the copper precursor is introduced into the reaction chamber and allowed to adsorb onto a substrate, the excess (unadsorbed) precursor vapor is pumped or purged from the chamber. The removal of excess precursor vapor is followed by introduction of a reducing agent that reacts with the copper precursor on the substrate surface to form copper metal and a free form of the ligand. This cycle can be repeated if needed to achieve the desired film thickness.

The ALD process differs from chemical vapor deposition (CVD) in the decomposition chemistry of the metal complex. In a CVD process, the complex undergoes pyrolytic decomposition on contact with the surface to give the desired film. In an ALD process, the complex is not completely decomposed to metal on contact with the surface. Rather, formation of the metal film takes place on introduction of a second reagent, which reacts with the deposited metal complex. In the preparation of a copper film from a copper(I) complex, the second reagent is a reducing agent. Advantages of an ALD process include the ability to control the film thickness and improved conformality of coverage because of the self-limiting adsorption of the precursor to the substrate surface in the first step of the process.

The ligands used in the ALD processes are desirably stable with respect to decomposition and should be able to desorb from the complex in a metal-free form. Following reduction of the copper, the ligand is liberated and must be removed from the surface to prevent its incorporation into the metal layer being formed.

US 2003/0135061 discloses a dimeric copper(I) precursor which can be used to deposit metal or metal-containing films on a substrate under ALD or CVD conditions.

SUMMARY OF THE INVENTION

One aspect of this invention is a process for forming copper deposits on a substrate comprising:
  a. contacting a substrate with a copper complex, (I), to form a deposit of a copper complex on the substrate; and
  b. contacting the deposited copper complex with a reducing agent, wherein

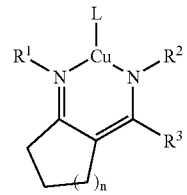

L is selected from the group consisting of $C_2$-$C_{15}$ olefins, $C_2$-$C_{15}$ alkynes, nitrites, aromatic heterocycles, and phosphines;
n is 1 or 2;
$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl;
$R^3$ is independently selected from $C_1$-$C_4$ alkyl, fluorine-substituted $C_1$-$C_4$ alkyl, and $Si(R^4)_3$, where each $R^4$ is independently $C_1$-$C_4$ alkyl; and
the reducing agent is selected from the group consisting of 9-BBN (9-borabicyclo[3.3.1]nonane); diborane; boranes of the form $BR_xH_{3-x}$, where x=0, 1 or 2, and R is independently selected from phenyl and $C_1$-$C_{10}$ alkyl groups; dihydrobenzofuran; pyrazoline; disilane; silanes of the form $SiR'_yH_{4-y}$, where y=0, 1, 2 or 3, and R' is independently selected from phenyl and $C_1$-$C_{10}$ alkyl groups; and germanes of the form $GeR''_zH_{4-z}$, where z=0, 1, 2, or 3, and R'' is independently selected from phenyl and $C_1$-$C_{10}$ alkyl groups.

Another aspect of the present invention is an article comprising a 1,3-diimine copper complex, (I), deposited on a substrate.

A further aspect of the present invention is a composition corresponding to copper complex, (I).

A further aspect of the invention is a composition corresponding to ligand, (II),

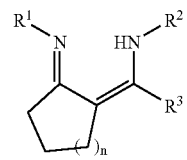

wherein
n is 1 or 2;
$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl; and
$R^3$ is independently selected from $C_1$-$C_4$ alkyl, fluorine-substituted $C_1$-$C_4$ alkyl, and $Si(R^4)_3$, where each $R^4$ is independently $C_1$-$C_4$ alkyl.

DETAILED DESCRIPTION

Applicants have discovered an atomic layer deposition (ALD) process suitable for creation of copper films for use as seed layers in the formation of copper interconnects in integrated circuits, or for use in decorative or catalytic applications. This process uses copper(I) complexes that are volatile at temperatures of about 50 to 120° C. at 350 mTorr to 1 Torr, thermally stable at conditions of 50 to 150° C. at 350 mTorr to 1 Torr, and derived from ligands that contain C, H, and N, but are not limited to these elements. The ligands are chosen so as to form copper(I) complexes that are volatile in an appropriate temperature range but do not decompose to copper metal in this temperature range. Rather, the complexes decompose to metal on addition of a suitable reducing agent. The ligands are further chosen so that they will desorb without decomposition upon exposure of the copper complex to a reducing agent. The reduction of these copper complexes to copper metal by commercially available reducing agents has been demonstrated to proceed cleanly at moderate temperatures.

In a process of this invention, copper is deposited on a substrate by:

a. contacting a substrate with a copper complex, (I), to form a deposit of a copper complex on the substrate; and

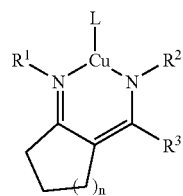

I b. contacting the deposited copper complex with a reducing agent, wherein

L is selected from the group consisting of $C_2$-$C_{15}$ olefins, $C_2$-$C_{15}$ alkynes, nitriles, aromatic heterocycles, and phosphines;

n is 1 or 2;

$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl;

$R^3$ is independently selected from $C_1$-$C_4$ alkyl, fluorine-substituted $C_1$-$C_4$ alkyl, and $(R^4)_3Si$, where each $R^4$ is independently $C_1$-$C_4$ alkyl; and the reducing agent is selected from the group consisting of 9-BBN (9-borabicyclo[3.3.1]nonane); diborane; boranes of the form $BR_xH_{3-x}$, where x=0, 1 or 2, and R is independently selected from phenyl and $C_1$-$C_{10}$ alkyl groups; dihydrobenzofuran; pyrazoline; disilane; silanes of the form $SiR'_yH_{4-y}$, where y=0, 1, 2 or 3, and R' is independently selected from phenyl and $C_1$-$C_{10}$ alkyl groups; and germanes of the form $GeR''_zH_{4-z}$, where z=0, 1, 2, or 3, and R'' is independently selected from phenyl and $C_1$-$C_{10}$ alkyl groups.

The present deposition processes allow the use of relatively low temperatures (e.g., about 0 to 200° C.) and produce high quality, uniform films. Desirable films are continuous and conductive. The processes also provide a direct route to a copper film, avoiding the need for formation of an intermediate oxide film.

In one embodiment of a copper deposition process, the copper can be deposited on the surface, or in and/or on porosity, of the substrate. Suitable substrates include conducting, semiconducting and insulating substrates, including copper, silicon wafers, wafers used in the manufacture of ultra large scale integrated circuits, wafers prepared with dielectric material having a lower dielectric constant than silicon dioxide, and silicon dioxide and low k substrates coated with a barrier layer. Barrier layers to prevent the migration of copper include tantalum, tantalum nitride, titanium, titanium nitride, tantalum silicon nitride, titanium silicon nitride, tantalum carbon nitride, and niobium nitride.

In some embodiments, the processes can be conducted in solution, i.e., by contacting a solution of the copper complex with the reducing agent. However, it may be preferred in some embodiments to expose the substrate to a vapor of the copper complex, and then remove any excess copper complex (i.e., undeposited complex) by vacuum or purging before exposing the deposited complex to a vapor of the reducing agent. After reduction of the copper complex, the free form of the ligand can be removed, for example, via vacuum, purging, heating, rinsing with a suitable solvent, or a combination of such methods.

This process can be repeated to build up thicker layers of copper, or to eliminate pin-holes.

The deposition of the copper complex is typically conducted at 0 to 200° C. The reduction of the copper complex is typically carried out at similar temperatures, 0 to 200° C., more preferably 50 to 150° C.

Initially a copper complex is deposited on the substrate. The formation of a metallic copper film does not occur until the copper complex is exposed to the reducing agent.

Aggressive reducing agents are preferred to reduce the copper complex rapidly and completely. Suitable reducing agents are volatile and do not decompose on heating. "Aggressive reducing agents" are of sufficient reducing power to react rapidly on contact with the copper complex deposited on the substrate surface. Suitable reducing agents have been identified that have been used for copper(I) reduction in an ALD process, as disclosed, for example, in patent publication WO 2004/094689. One feature of these reagents is the presence of a proton donor. The reducing agent is desirably able to transfer at least one electron to reduce the copper ion of the complex and at least one proton to protonate the ligand. It is also desirable that the oxidized reducing agent and the protonated ligand be able to be easily removed from the surface of the newly formed copper deposit. Preferably, the protonated ligand is removed by vacuum, by purging or by flushing the surface with a suitable solvent.

Suitable reducing agents for the copper deposition processes include 9-BBN, borane, diborane, dihydrobenzofuran, pyrazoline, germanes, diethylsilane, dimethylsilane, ethylsilane, phenylsilane, silane and disilane. Diethylsilane and silane are preferred.

In one embodiment of a copper deposition process, the copper complexes are admitted to a reactor chamber containing the substrate under conditions of temperature, time and pressure to attain a suitable fluence of vaporized complex to the surface of the substrate. The selection of these variables (time, T, P) will depend on individual chamber and system design, and the desired process rate, but as a general guideline, temperatures within the range of about 0 to 200° C.; pressures within the range of about 100 to 180 mTorr; and a time period of at least 30 seconds to 1 minute can be used. After at least a portion of the copper complex has been deposited on the substrate, the undeposited complex vapor is removed from the chamber (e.g., by pumping or purging) and the reducing agent is introduced into the chamber at a pressure of about 50 to 760 mTorr to reduce the adsorbed copper complex. The substrate is held at a temperature of about 0 to 200° C. during reduction. With suitable combinations of copper complex and reducing agent, this reduction is rapid (i.e., can generally be completed within a time range of one second to several minutes for most complexes) and substantially complete (e.g., about 95% complete or more). Desirably, the reaction is at least 95% complete within an exposure time of from less than one second to several minutes. It is desired that the products from this reaction are readily removed from the surface of the substrate under the reducing conditions.

In one embodiment, the copper complex is a copper 1,3-diimine complex (I), wherein $R^1$ and $R^2$ are ethyl groups, $R^3$ is a methyl group, n=1, L=vinyltrimethylsilane, and the reducing agent is diethylsilane.

This invention also provides novel 1,3-diimine copper complexes, (I),

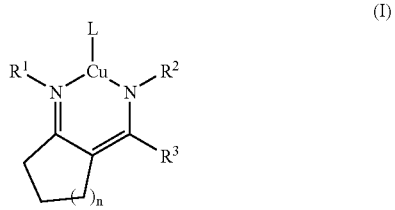

(I)

wherein

L is selected from the group consisting of $C_2$-$C_{15}$ olefins, $C_2$-$C_{15}$ alkynes, nitrites, aromatic heterocycles, and phosphines;

n is 1 or 2;

$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl; and $R^3$ is independently selected from $C_1$-$C_4$ alkyl, fluorine-substituted $C_1$-$C_4$ alkyl, and $Si(R^4)_3$, where each $R^4$ is independently $C_1$-$C_4$ alkyl.

In one embodiment, L is a linear, terminal olefin. For olefins of 4-15 carbons, L can also be an internal olefin of cis- or trans-configuration; cis-configuration is preferred. L can be a cyclic or bicyclic olefin. L can also be substituted, for example with fluorine or silyl groups. Suitable olefins include, but are not limited to, vinyltrimethylsilane, allyltrimethylsilane, 1-hexene, 4-methyl-1-pentene, 3,3-dimethyl-1-butene, and norbornene. L can also be alkyne, nitrile, or an aromatic nitrogen heterocycle such as pyridine, pyrazine, triazine, or N-substituted imidazole, pyrazole, or triazole. L can also be a phosphine.

This invention also provides ligands of Formula (II)

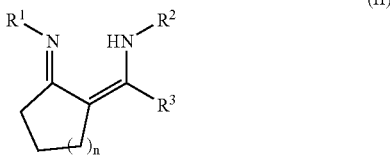

(II)

wherein n is 1 or 2;

$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl;

$R^3$ is independently selected from $C_1$-$C_4$ alkyl, fluorine-substituted $C_1$-$C_4$ alkyl, and $Si(R^4)_3$, where each $R^4$ is independently $C_1$-$C_4$ alkyl. When $R^3$ is a $C_2$-$C_4$ alkyl group, it can also contain a silylene group in the alkyl chain, e.g., —$CH_2SiH_2CH_3$ or —$CH_2Si(H)(CH_3)CH_3$ or —$CH_2Si(CH_3)_2CH_3$.

A method for the synthesis of one ligand useful for making the copper complexes is illustrated in Examples below. Thus, 1-aza-1-cycloalkylidenealkane can be deprotonated by strong base, then treated with an electrophile such as an ester or acid halide derivative to provide the corresponding keto exocyclic enamine as an intermediate. Treatment of this intermediate with an alkylating agent such as dimethylsulfate, followed by the addition of a primary amine affords the desired exocyclic diketimine. Alternatively, the exocyclic ketimine, after deprotonation by strong base, can be directly coupled with an imidoyl derivative to provide the desired β-diketimine. Other ligands can be prepared similarly.

In another embodiment, this invention provides an article comprising a 1,3-diimine copper complex of structure (I), deposited on a substrate. Suitable substrates include: copper, silicon wafers, wafers used in the manufacture of ultra-large scale integrated circuits, wafers prepared with dielectric material having a lower dielectric constant than silicon dioxide, and silicon dioxide and low k substrates coated with a barrier layer. Barrier layers can be used to prevent the migration of copper into the substrate. Suitable barrier layers include: tantalum, tantalum nitride, titanium, titanium nitride, tantalum silicon nitride, titanium silicon nitride, tantalum carbon nitride, and niobium nitride.

EXAMPLES

Unless otherwise stated, all organic reagents are available from Sigma-Aldrich Corporation (Milwaukee, Wis., USA). [$Cu(CH_3CN)_4$]$SO_3CF_3$ can be prepared according to the method described in: T. Ogura, Transition Metal Chemistry, 1, 179-182 (976).

Example 1

Preparation of
3-Aza-2-[2-(azapropylidene)cyclopentyl]pent-2-ene

A mixture of cyclopentanone (21 g, 250 mmol), ethylamine (125 mL, 2.0 M solution in THF), and dried molecular sieves (100 g) in ether (300 mL) was stirred at room temperature for 3 days. The reaction mixture was filtered, and the filtrate was concentrated under reduced pressure. The concentrated filtrate was distilled under vacuum (65° C., 10 mm Hg) to provide 1-aza-1-cyclopentylidenepropane (18 g, 65%).

7 g of 1-aza-1-cyclopentylidenepropane (62.9 mmol) in THF (5 mL) was added dropwise to an LDA solution (132.2 mmol in 250 mL THF) at −78° C. After stirring the mixture at −10° C. for 40 min, ethylacetate (5.6 g, 62.9 mmol) was added at −78° C. The reaction mixture was stirred as the temperature was allowed to gradually rise to room temperature, and was continuously stirred at room temperature overnight. Methanol (20 mL) was added dropwise to the mixture, then the solvent was removed under reduced pressure. After adding water (200 mL) to the residue, the mixture was extracted with ether (200 mL×2). The combined organic layer was dried over anhydrous $MgSO_4$, then filtered. Concentration of the filtrate under reduced pressure, followed by column chromatography provided 7.2 g of β-ketoenamine product (75%).

A mixture of 5.5 g of β-ketoenamine (35.9 mmol) and dimethylsulfate (4.53 g, 35.9 mmol) was stirred at room temperature overnight, giving a solidified mixture. Then ethylamine (24 mL, 46.7 mmol, 2.0 M in THF, 1.3 eq) was added dropwise to the mixture. After stirring the mixture at room temperature overnight, solvent was removed under reduced pressure. After adding sodium methoxide solution (1.94 g, in 20 mL of methanol, 35.9 mmol) to the residue, the mixture was concentrated under reduced pressure. Pentane (50 mL)

was added to the concentrated residue, then the resultant mixture was filtered. Concentrating the filtrate under reduced pressure, followed by vacuum distillation (60° C., 50 mTorr) provided 5.1 g of product, 3-aza-2-[2-(azapropylidene)cyclopentyl]pent-2-ene (78%).

Example 2

Preparation and Reduction of Vinyltrimethylsilane[3-Aza-2-[2-(azapropylidene)cyclopentyl]pent-2-enate] copper In a dry box, 3-aza-2-[2-(azapropylidene)cyclopentyl]pent-2-ene, (0.5 g, 2.77 mmol) was dissolved in ether (10 mL), then $^t$BuLi (1.63 mL, 2.77 mmol, 1.7 M in pentane) was added dropwise to the solution. The mixture was stirred at room temperature for 10 min. Meanwhile, Cu[(CH$_3$CN)$_4$]SO$_3$CF$_3$ (1.04 g, 2.77 mmol) and vinyltrimethylsilane (0.83 g, 8.31 mmol) were mixed together in ether (15 mL), and the mixture was stirred at room temperature for 10 min. The butyl lithium solution was added to the copper mixture, and the resultant mixture was stirred at room temperature for 1 h. The reaction mixture was concentrated under vacuum, followed by the addition of pentane (30 mL) to the residue. Filtration, followed by concentration of the filtrate, afforded a desired product as a viscous oil (0.88 g, 89% yield).

Reduction on a substrate: The viscous oil was used as a copper precursor to create a copper film on a substrate. The substrate consisted of a silicon dioxide wafer with 250-Angstrom layer of tantalum and a 100 Angstrom layer of copper.

Approximately 0.04 g of copper precursor was loaded in the dry box into a porcelain boat. The boat and wafer (~1 cm$^2$) were placed in a glass tube approximately 3.5 inches apart. The glass tube was removed from the dry box and attached to a vacuum line. Heating coils were attached to the glass tube surrounding both the area around the porcelain boat and the area around the wafer chip. This configuration allows the two areas to be maintained at different temperatures. Following evacuation of the system, an argon flow was created through the tube, passing first over the sample in the boat and then over the wafer. The pressure inside the tube was maintained at 100-180 mTorr. The region around the wafer was warmed to 120° C. After approximately an hour, the temperature of the region around the sample boat was raised to 60° C. These temperatures and gas flow were maintained for approximately 2 hours. The area around the sample boat was then cooled to room temperature. The tube was evacuated to a pressure of ~10 mTorr and was back-filled with diethylsilane. The area of the tube at 110° C. quickly turned a copper color. The apparatus was cooled and returned to the dry box. The copper color was perceptibly darker. The process was repeated to yield a wafer with a smooth copper film.

Example 3

Preparation of Vinyltrimethylsilane[2-Aza-3-[2-(azapropylidene)cyclopentyl]but-2-enate]copper To a solution of diisopropylamine (10.9 g, 108.1 mmol) in THF (250 mL) was dropwise added n-BuLi (2.89 M, 37.6 mL, 108.1 mmol) at −78° C. under nitrogen. Once all the n-BuLi was added, the temperature was adjusted to −5° C., and the reaction mixture was stirred for 30 min. Then a solution of 1-aza-1-cyclopentylidenepropane (5 g, 51.50 mmol) in THF (10 mL) was added dropwise to the reaction mixture at −5° C., and then stirred. After 30 min, methyl N-methylthioacetimidate (5.3 g, 51.5 mmol) was added dropwise over 30 min at −78° C. The reaction mixture was stirred as the temperature was allowed to gradually rise to room temperature, and was then continuously stirred at room temperature overnight. THF solvent was removed under reduced pressure, then 30 mL of methanol was added dropwise to the residue. After removing all of the volatile solvent, pentane (50 mL×2) was added to the residue, and the mixture was filtered. Concentration of the filtrate under reduced pressure, followed by vacuum distillation (55° C. at 60 mTorr) provided 5.3 g of 2-aza-3-[2-(azapropylidene)cyclopentyl]but-2-ene (62%). In a dry box, 2-aza-3-[2-(azapropylidene)cyclopentyl]but-2-ene, (0.3 g, 1.80 mmol) was dissolved in ether (15 mL), then $^t$BuLi (1.06 mL, 1.80 mmol, 1.7 M in pentane) was added dropwise to the solution. The mixture was stirred at room temperature for 10 min. Meanwhile, Cu[(CH$_3$CN)$_4$]SO$_3$CF$_3$ (0.67 g, 1.80 mmol) and vinyltrimethylsilane (0.90 g, 9.0 mmol) were mixed together in ether (15 mL), and the mixture was stirred at room temperature for 5 min. The butyl lithium solution was added to the copper mixture, and the resultant mixture was stirred at room temperature for 40 min. The reaction mixture was concentrated under vacuum, followed by the addition of pentane (30 mL) to the residue. Filtration, followed by concentration of the filtrate, afforded the desired product as a white solid (0.568 g, 94% yield).

What is claimed is:

1. A copper complex, (I),

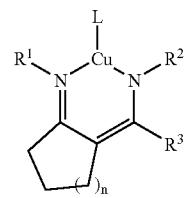

wherein

L is selected from the group consisting of $C_2$-$C_{15}$ olefins, $C_2$-$C_{15}$ alkynes, nitriles, aromatic heterocycles, and phosphines;

n is 1 or 2; and $R^1$ and $R^2$ are independently selected from the group consisting of H, $C_1$-$C_4$ alkyl, fluorine-substituted $C_1$-$C_4$ alkyl, and Si($R^4$)$_3$, where each $R^4$ is independently $C_1$-$C_4$ alkyl; and $R^3$ is independently selected from $C_1$-$C_4$ alkyl, fluorine-substituted $C_1$-$C_4$ alkyl, and Si($R^4$)$_3$, where each $R^4$ is independently selected from $C_1$-$C_4$ alkyl.

2. The copper complex (I) of claim 1, wherein

L is vinyltrimethylsilane; $R^1$ and $R^2$ are methyl or ethyl, and $R^3$ is methyl.

3. A process for forming copper deposits on a substrate comprising:

a. contacting a substrate with a copper complex, (I), to form a deposited copper complex on the substrate; and

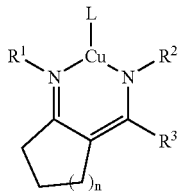

b. contacting the deposited copper complex with a reducing agent, wherein:

L is selected from the group consisting of $C_2$-$C_{15}$ olefins, $C_2$-$C_{15}$ alkynes, nitriles, aromatic heterocycles, and phosphines;

n is 1 or 2;

$R^1$ and $R^2$ are independently selected from the group consisting of H, $C_1$-$C_4$ alkyl, fluorine-substituted $C_1$-$C_4$ alkyl, and $Si(R^4)_3$, where each $R^4$ is independently $C_1$-$C_4$ alkyl;

$R^3$ is independently selected from $C_1$-$C_4$ alkyl, fluorine-substituted $C_1$-$C_4$ alkyl, and $Si(R^4)_3$, where each $R^4$ is independently selected from $C_1$-$C_4$ alkyl; and the reducing agent is selected from the group consisting of 9-borabicyclo[3.3.1]nonane; diborane; boranes of the form $BR_xH_{3-x}$, where x=0, 1 or 2, and R is independently selected from phenyl and $C_1$-$C_{10}$ alkyl groups; dihydrobenzofuran; pyrazoline; disilane; silanes of the form $SiR'_yH_{4-y}$, where y=0, 1, 2 or 3, and R' is independently selected from phenyl and $C_1$-$C_{10}$ alkyl groups; and germanes of the form $GeR''_zH_{4-z}$, where z=0, 1, 2, or 3, and R" is independently selected from phenyl and $C_1$-$C_{10}$ alkyl groups.

4. The process of claim 3, wherein $R^1$ and $R^2$ are ethyl.

5. The process of claim 3, wherein $R^3$ is methyl.

6. The process of claim 3, wherein n is 1.

7. The process of claim 3, wherein L is vinyltrimethylsilane.

8. The process of claim 3, wherein the substrate is selected from copper, silicon wafers and silicon dioxide coated with a barrier layer.

9. The process of claim 3, wherein the contacting comprises exposing the substrate to a vapor of the copper complex.

10. The process of claim 3, wherein the process is carried out at a temperature of 0 to 200° C.

11. The process of claim 3, wherein the reducing agent is silane or diethylsilane.

* * * * *